(12) United States Patent
Zhai

(10) Patent No.: US 10,411,132 B2
(45) Date of Patent: Sep. 10, 2019

(54) THIN FILM TRANSISTOR AND METHOD FOR MANUFACTURING THE SAME

(71) Applicant: Shenzhen China Star Optoelectronics Technology Co., Ltd., Shenzhen, Guangdong (CN)

(72) Inventor: Yuhao Zhai, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 177 days.

(21) Appl. No.: 15/324,702

(22) PCT Filed: Nov. 11, 2016

(86) PCT No.: PCT/CN2016/105433
§ 371 (c)(1),
(2) Date: Jun. 22, 2017

(87) PCT Pub. No.: WO2018/040287
PCT Pub. Date: Mar. 8, 2018

(65) Prior Publication Data
US 2018/0182896 A1   Jun. 28, 2018

(30) Foreign Application Priority Data
Aug. 31, 2016  (CN) .......................... 2016 1 0778598

(51) Int. Cl.
| H01L 29/786 | (2006.01) |
| H01L 21/84 | (2006.01) |
| H01L 27/12 | (2006.01) |
| H01L 29/45 | (2006.01) |

(Continued)

(52) U.S. Cl.
CPC .... *H01L 29/78606* (2013.01); *H01L 27/1225* (2013.01); *H01L 27/1262* (2013.01);
(Continued)

(58) Field of Classification Search
CPC ............. H01L 27/1225; H01L 27/1262; H01L 27/1288; H01L 29/41733; H01L 29/45;
(Continued)

(56) References Cited

U.S. PATENT DOCUMENTS 5,407,845 A * 4/1995 Nasu .................... H01L 21/2236
                                                   438/30
6,147,722 A * 11/2000 Shimada ........... G02F 1/136227
                                                  349/123

(Continued)

FOREIGN PATENT DOCUMENTS

CN         202940240 U      5/2013

*Primary Examiner* — Mary A Wilczewski

(57) ABSTRACT

A TFT is disclosed. An anti-damage layer is arranged between an active layer and a source of the TFT, and the anti-damage layer is arranged between the active layer and a drain of the TFT. According to the present disclosure, the TFT has a simple structure. Through arranging the anti-damage layer between the active layer and the source of the TFT and between the active layer and the drain of the TFT, the length of the channel can be effectively reduced, and the parasite capacitor between the source and the gate of the TFT and between the drain and the gate of the TFT can be reduced.

6 Claims, 3 Drawing Sheets

(51) Int. Cl.
  *H01L 29/49* (2006.01)
  *H01L 29/417* (2006.01)
  *H01L 29/66* (2006.01)
(52) U.S. Cl.
  CPC .... *H01L 27/1288* (2013.01); *H01L 29/41733* (2013.01); *H01L 29/45* (2013.01); *H01L 29/4908* (2013.01); *H01L 29/66969* (2013.01); *H01L 29/78618* (2013.01); *H01L 29/78693* (2013.01)
(58) Field of Classification Search
  CPC ........... H01L 29/4908; H01L 29/66969; H01L 29/78606; H01L 29/78618; H01L 29/78693
  See application file for complete search history.

(56) References Cited

U.S. PATENT DOCUMENTS

| | | | | |
|---|---|---|---|---|
| 9,018,053 | B2* | 4/2015 | Choi | G02F 1/13458 438/158 |
| 9,355,838 | B2* | 5/2016 | Wang | H01L 21/02172 |
| 2008/0078992 | A1 | 4/2008 | Yang et al. | |
| 2008/0122373 | A1* | 5/2008 | Cho | H01L 27/3272 315/169.4 |
| 2010/0123132 | A1* | 5/2010 | Nakata | H01L 29/7869 257/43 |
| 2010/0323482 | A1* | 12/2010 | Choi | G02F 1/13458 438/158 |
| 2012/0211755 | A1* | 8/2012 | Fujimori | H01L 29/78606 257/59 |
| 2012/0280223 | A1* | 11/2012 | Kim | H01L 29/7869 257/43 |
| 2013/0187164 | A1* | 7/2013 | Oshima | H01L 29/78693 257/59 |
| 2014/0014945 | A1* | 1/2014 | Chang | H01L 29/7869 257/43 |
| 2014/0061633 | A1* | 3/2014 | Wang | H01L 21/02172 257/43 |
| 2014/0291668 | A1* | 10/2014 | Morosawa | H01L 27/1225 257/43 |
| 2015/0340455 | A1 | 11/2015 | Cao et al. | |
| 2017/0229571 | A1* | 8/2017 | Choi | H01L 21/0226 |
| 2018/0182896 | A1* | 6/2018 | Zhai | H01L 29/41733 |

\* cited by examiner

THIN FILM TRANSISTOR AND METHOD FOR MANUFACTURING THE SAME

CROSS REFERENCE TO RELATED APPLICATION

The present application claims priority of Chinese patent application CN201610778598.6, entitled "Thin Film Transistor and Method for Manufacturing the Same" and filed on Aug. 31, 2016, the entirety of which is incorporated herein by reference.

FIELD OF THE INVENTION

The present disclosure relates to the technical field of thin film transistor (TFT), and particularly to a TFT and a method for manufacturing the same.

BACKGROUND OF THE INVENTION

A metal oxide film is very sensitive to acid, and a metal oxide semiconductor can even be corroded by a weak acid rapidly. Therefore, an etch-proof indium gallium zinc oxide (IGZO) TFT structure is generally used. That is, an etch-proof layer is deposited on the metal oxide, so that the IGZO layer can be prevented from being damaged when a source and a drain of the TFT are manufactured, and a performance of a TFT substrate can be improved. However, an additional photolithography procedure is needed, and thus the manufacturing procedure of the metal oxide IGZO TFT is increased. Moreover, during a production procedure of TFT in the prior art, due to the influences of exposure deviation and etch error, the etch-proof layer cannot be manufactured with a short length. As a result, a length of a channel is increased inevitably, and a parasite capacitor of the component is increased.

In order to solve the aforesaid technical problem, a new TFT is provided.

SUMMARY OF THE INVENTION

The present disclosure provides a new TFT and a method for manufacturing the same. According to the present disclosure, the TFT has a simple structure. In the TFT, a length of a channel can be effectively reduced, and a parasite capacitor between a source and a gate of the TFT and between a drain and the gate of the TFT can be reduced. According to the present disclosure, the method for manufacturing the TFT is simple, and thus the TFT can be manufactured conveniently.

In order to achieve the aforesaid purpose, the present disclosure provides a new TFT and a method for manufacturing the same. An anti-damage layer is arranged between an active layer and a source of the TFT, and the anti-damage layer is arranged between the active layer and a drain of the TFT.

In the aforesaid TFT, the anti-damage layer is made of Indium Tin Oxide (ITO).

The TFT comprises:
a glass layer;
a gate that is arranged on the glass layer;
a gate insulation layer that is arranged on the gate;
the active layer that is arranged on the gate insulation layer, and a first etch-proof layer that is arranged on the active layer, wherein a length of the active layer is less than a length of the gate insulation layer and larger than a length of the first etch-proof layer;
the source that is arranged at one side of the active layer;
the anti-damage layer that is arranged between the active layer and the source;
the drain that is arranged at the other side of the active layer;
the anti-damage layer that is arranged between the active layer and the drain;
two pixel electrodes, wherein one pixel electrode is arranged at one side of the source far from the active layer, and the other pixel electrode is arranged at one side of the drain far from the active layer;
a second etch-proof layer that is arranged at two sides of the gate respectively, wherein the second etch-proof layer is arranged between the glass layer and the pixel electrodes;
a second anti-damage layer that is arranged between the second etch-proof layer and the active layer; and
a protection layer that is arranged on the first etch-proof layer.

In the aforesaid TFT, the gate is made of Al/Mo composite or Al/Cu composite, and the source and the drain are both made of Al/Mo composite or Cu/Mo composite.

In the aforesaid TFT, the gate insulation layer, the first etch-proof layer, and the second etch-proof layer are all made of silicon dioxide or alumina.

In the aforesaid TFT, the pixel electrodes are made of ITO.

The present disclosure further provides a method for manufacturing a TFT,
wherein an anti-damage layer is arranged between an active layer and a source of the TFT, and the anti-damage layer is arranged between the active layer and a drain of the TFT; and
wherein the method comprises steps of:
S1, forming a gate on a glass layer, forming a gate insulation layer on the gate, forming the active layer on the gate insulation layer, forming a first etch-proof layer on the active layer, and enabling a length of the active layer to be less than a length of the gate insulation layer and larger than a length of the first etch-proof layer;
S2, forming the source at one side of the active layer, forming the anti-damage layer between the active layer and the source, forming the drain at the other side of the active layer, and forming the anti-damage layer between the active layer and the drain;
S3, forming two pixel electrodes, i.e., forming one pixel electrode at one side of the source far from the active layer, and forming the other pixel electrode at one side of the drain far from the active layer;
forming a second etch-proof layer at two sides of the gate respectively, and enabling the second etch-proof layer to be between the glass layer and the pixel electrodes; and
S4, forming a protection layer on the first etch-proof layer.

The method further comprises step S30 between step S3 and step S4:
step S30, forming a second anti-damage layer between the second etch-proof layer and the active layer.

According to the method, the anti-damage layer and the second anti-damage layer are both made of ITO.

According to the method, the anti-damage layer and the second anti-damage layer are formed by steps of:
A, forming a photoresist on the first etch-proof layer, forming the photoresist on the second etch-proof layer, forming the anti-damage layer on the photoresist, forming the anti-damage layer between the active layer and the source, forming the anti-damage layer between the active layer and the drain, and forming the second anti-damage layer between the second etch-proof layer and the active layer;

B, removing the photoresist on the first etch-proof layer and the anti-damage layer on the photoresist, and removing the photoresist on the second etch-proof layer and the anti-damage layer on the photoresist; and C, performing annealing on the anti-damage layer and the second anti-damage layer at a temperature in a range from 200° C. to 300° C.

According to the present disclosure, the TFT has a simple structure. Through arranging the anti-damage layer between the active layer and the source of the TFT and between the active layer and the drain of the TFT, the length of the channel can be effectively reduced, and the parasite capacitor between the source and the gate of the TFT and between the drain and the gate of the TFT can be reduced. According to the present disclosure, the method for manufacturing the TFT is simple, and the TFT with a short channel length can be manufactured.

BRIEF DESCRIPTION OF THE DRAWINGS

The present disclosure will be illustrated in detail hereinafter with reference to the embodiments and the accompanying drawings. In the drawings.

Figure 1:
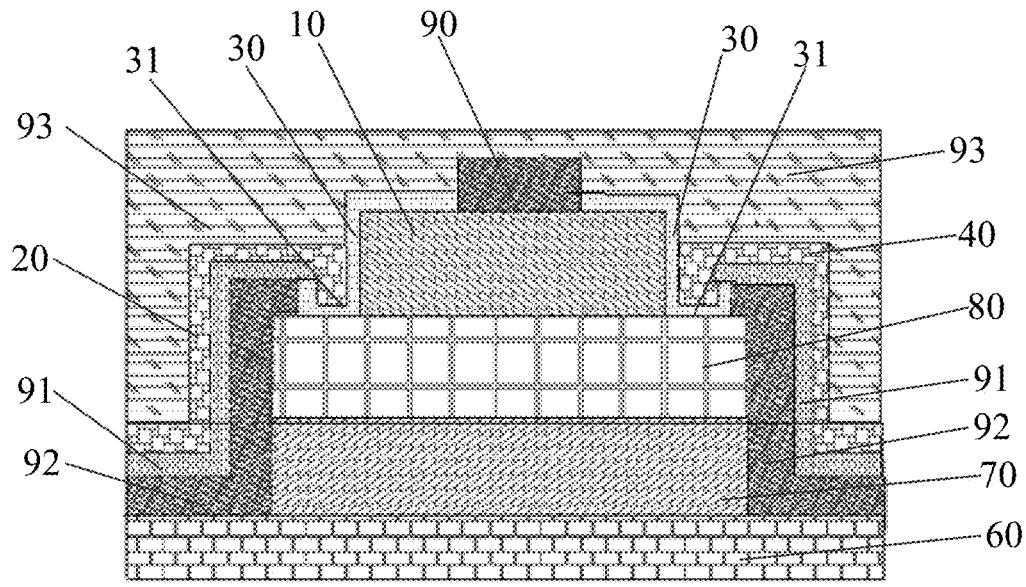
FIG. 1 schematically shows a structure of a TFT according to the present disclosure.

In the drawings, the same components are represented by the same reference signs, and the size of each component does not represent the actual size of the corresponding component.

DETAILED DESCRIPTION OF THE EMBODIMENTS

The details of the present disclosure can be understood more clearly combining the description on the drawings and embodiments. However, the embodiments disclosed herein are only used for illustrating the present disclosure, while cannot be understood as a limitation on the present disclosure. Under the teaching of the present disclosure, those skilled in the art can make any changes, and all these changes belong to the protection scope of the present disclosure. The present disclosure will be further illustrated hereinafter with reference to the drawings.

FIGS. 1 to 6 respectively show a structure of a TFT, a structure of a TFT during manufacturing procedure 1, a structure of a TFT during manufacturing procedure 2, a structure of a TFT during manufacturing procedure 3, a structure of a TFT during manufacturing procedure 4, and a structure of a TFT during manufacturing procedure 5 according to the present disclosure.

Embodiment 1

As shown in FIG. 1, the present disclosure provides a TFT, wherein an anti-damage layer 30 is arranged between an active layer 10 and a source 20 of the TFT, and the anti-damage layer 30 is arranged between the active layer 10 and a drain 40 of the TFT.

Specifically, according to the present disclosure, the anti-damage layer is made of Indium Tin Oxide (ITO). Of course, the anti-damage layer can also be made of other materials which can play the same role, and the present disclosure is not limited by this.

In the TFT according to the present disclosure, through arranging the anti-damage layer 30 between the active layer 10 and the source 20 of the TFT and between the active layer 10 and the drain 40 of the TFT, the length of the channel can be effectively reduced, and the parasite capacitor between the source 20 and the gate 70 of the TFT and between the drain 40 and the gate 70 of the TFT can be reduced.

There are many kinds of TFT in the prior art. The TFT according to the present disclosure is manufactured based on the TFT in the prior art. According to one embodiment of the present disclosure, the TFT comprises a glass layer 60, a gate 70, a gate insulation layer 80, the active layer 10, a first etch-proof layer 90, the source 20, the anti-damage layer 30, the drain 40, a pixel electrode 91, a second etch-proof layer 92, and a protection layer 93. The gate 70 is arranged on the glass layer 60; the gate insulation layer 80 is arranged on the gate 70; the active layer 10 is arranged on the gate insulation layer 80; and the first etch-proof layer 90 is arrange on the active layer 10. A length of the active layer 10 is less than a length of the gate insulation layer 80 and larger than a length of the first etch-proof layer 90. The source 20 and the drain 40 are arranged at two sides of the active layer 10 respectively. The anti-damage layer 30 is arranged between the active layer 10 and the source 20 and between the active layer 10 and the drain 40. One pixel electrode 91 is arranged at one side of the source 20 far from the active layer 10, and the other pixel electrode 91 is arranged at one side of the drain 40 far from the active layer 10. A second etch-proof layer 92 is arranged at two sides of the gate 70 respectively. The second etch-proof layer 92 is arranged between the glass layer 60 and the pixel electrodes 91. The protection layer 93 is arranged on the first etch-proof layer 90. Further, according to the present disclosure, a second anti-damage layer 31 is arranged between the second etch-proof layer 92 and the active layer 10. Of course, the TFT can have other structures. The TFTs in which the anti-damage layer 30 is arranged between the active layer 10 and the source 20 and between the active layer 10 and the drain 40 all fall within the protection scope of the present disclosure.

Specifically, the second anti-damage layer 31 and the anti-damage layer 30 are both made of Indium Tin Oxide (ITO). According to the present disclosure, the anti-damage layer 30 and the second anti-damage layer 31 are made of a same material. After an etching procedure, one anti-damage layer is cut so as to form the anti-damage layer 30 and the second anti-damage layer 31 disclosed herein.

Specifically, according to the present disclosure, the gate 70 is made of Al/Mo composite or Al/Cu composite. Of course, the gate 70 can also be made of other materials, and the present disclosure is not limited by this. The source and the drain (S/D) are both made of Al/Mo composite or Cu/Mo composite. Of course, the S/D can also be made of other metal composites, and the present disclosure is not limited by this.

Specifically, according to the present disclosure, the gate insulation layer 80 is made of silicon dioxide ($SiO_2$) or alumina ($Al_2O_3$). Of course, the gate insulation layer 80 can also be made of other materials, and the present disclosure is not limited by this. Further, according to the present disclosure, the first etch-proof layer 90 and the second etch-proof layer 92 are made of a same material. According to the present disclosure, after an etching procedure, one etch-proof layer is cut so as to form the first etch-proof layer 90 and the second etch-proof layer 92 disclosed herein. The etch-proof layer is made of $SiO_2$ or $Al_2O_3$. Of course, the etch-proof layer can also be made of other materials, and the present disclosure is not limited by this.

Further, according to the present disclosure, the pixel electrodes 91 of the TFT are made of ITO. Of course, the pixel electrodes 91 can also be made of other materials, and the present disclosure is not limited by this.

In the TFT according to the present disclosure, the anti-damage layer 30 is arranged between the active layer 10 and the source 20 and between the active layer 10 and the drain 40. According to the present disclosure, the ITO with a self-aligned structure is deposited on an amorphous IGZO (a-IGZO) layer and serves as the anti-damage layer and a contact layer between the active layer and the source and between the active layer and the drain, whereby the a-IGZO TFT component with a short channel length can be manufactured. Moreover, since the S/D does not extend to a surface of the etch-proof layer, an effective overlap area between the S/D and the gate can be reduced, and the parasite capacitor of the component can be reduced. The ITO with a self-aligned structure serves as the anti-damage layer and the contact layer, so that the length of the channel can be reduced by 1 μm to 5 μm, and the parasite capacitor between the S/D and the gate can be reduced.

Embodiment 2

The present disclosure further provides a method for manufacturing a TFT. An anti-damage layer 30 is arranged between an active layer 10 and a source 20 of the TFT, and the anti-damage layer 30 is arranged between the active layer 10 and a drain 40 of the TFT. The method for manufacturing the TFT comprises following steps.

In step S1, a gate 70 is formed on a glass layer 60; a gate insulation layer 80 is formed on the gate 70; the active layer 10 is formed on the gate insulation layer 80; and a first etch-proof layer 90 is formed on the active layer 10. A length of the active layer 10 is less than a length of the gate insulation layer 80 and larger than a length of the first etch-proof layer 90.

In step S2, the source 20 is formed at one side of the active layer 10, and the anti-damage layer 30 is formed between the active layer 10 and the source 20. The drain 40 is formed at the other side of the active layer 10, and the anti-damage layer 30 is formed between the active layer 10 and the drain 40.

In step S3, two pixel electrodes 91 are formed, i.e., one pixel electrode 91 is formed at one side of the source 20 far from the active layer 10, and the other pixel electrode 91 is formed at one side of the drain 40 far from the active layer 10. A second etch-proof layer 92 is formed at two sides of the gate 70 respectively, and the second etch-proof layer 92 is arranged between the glass layer 60 and the pixel electrodes 91.

In step S4, a protection layer 93 is formed on the first etch-proof layer 90.

Further, the method comprises step S30 between step S3 and step S4. In step S30, a second anti-damage layer 31 is formed between the second etch-proof layer 92 and the active layer 10.

Specifically, the anti-damage layer 30 and the second anti-damage layer 31 are both made of ITO.

Further, the anti-damage layer 30 and the second anti-damage layer 31 are formed by following steps.

In step A, a photoresist 94 is formed on the first etch-proof layer 90; the photoresist 94 is formed on the second etch-proof layer 92; the anti-damage layer 30 is formed on the photoresist 94; the anti-damage layer 30 is formed between the active layer 10 and the source 20; the anti-damage layer 30 is formed between the active layer 10 and the drain 40; and the second anti-damage layer 31 is formed between the second etch-proof layer 92 and the active layer 10.

In step B, the photoresist 94 on the first etch-proof layer 90 and the anti-damage layer 30 on the photoresist 94 are removed, and the photoresist 94 on the second etch-proof layer 92 and the anti-damage layer 30 on the photoresist 94 are removed.

In step C, the anti-damage layer 30 and the second anti-damage layer 31 are annealed at a temperature in a range from 200° C. to 300° C.

Specifically, according to the present disclosure, the gate 70 is made of Al/Mo composite or Al/Cu composite. Of course, the gate 70 can also be made of other materials, and the present disclosure is not limited by this. The source and the drain (S/D) are both made of Al/Mo composite or Cu/Mo composite. Of course, the S/D can also be made of other metal composites, and the present disclosure is not limited by this.

Specifically, according to the present disclosure, the gate insulation layer 80 is made of silicon dioxide ($SiO_2$) or alumina ($Al_2O_3$). Of course, the gate insulation layer 80 can also be made of other materials, and the present disclosure is not limited by this. Further, according to the present disclosure, the first etch-proof layer 90 and the second etch-proof layer 92 are made of a same material. The etch-proof layer is made of $SiO_2$ or $Al_2O_3$. Of course, the etch-proof layer can also be made of other materials, and the present disclosure is not limited by this.

Further, according to the present disclosure, the pixel electrodes 91 of the TFT are made of ITO. Of course, the pixel electrodes 91 can also be made of other materials, and the present disclosure is not limited by this.

Figure 2:
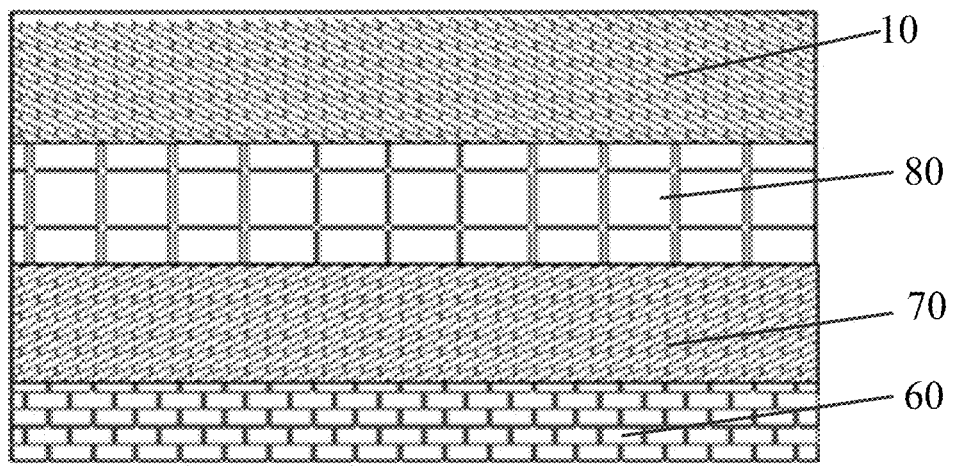
FIG. 2 schematically shows a structure of a TFT during manufacturing procedure 1 according to the present disclosure.
Figure 3:
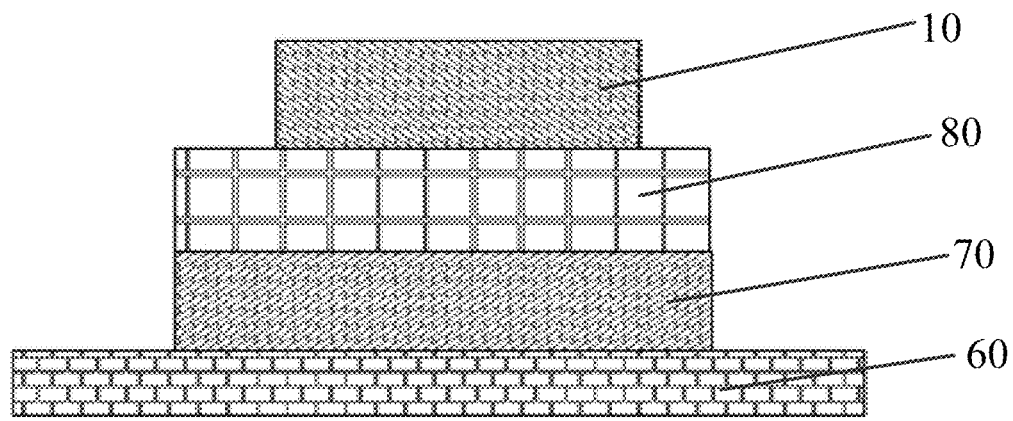
FIG. 3 schematically shows a structure of a TFT during manufacturing procedure 2 according to the present disclosure.
Figure 4:
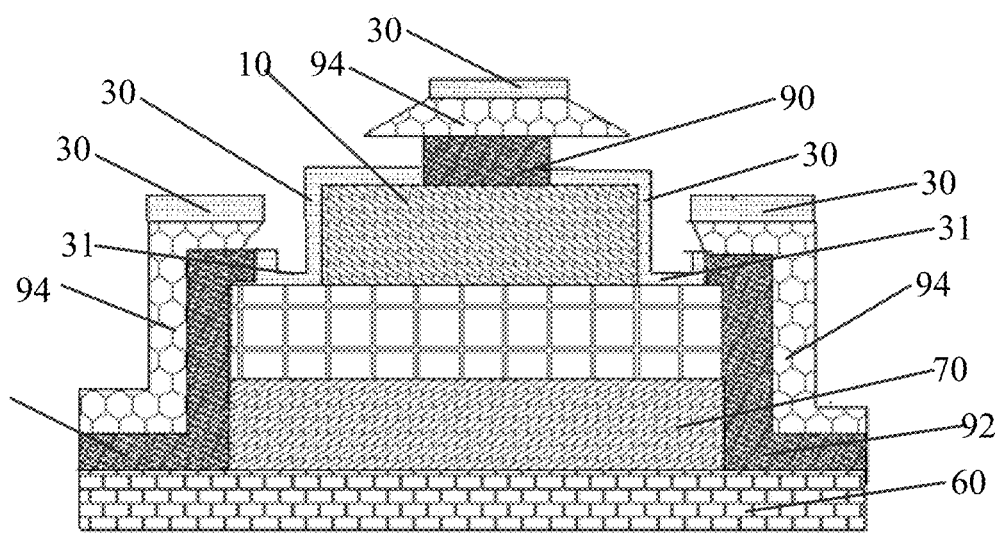
FIG. 4 schematically shows a structure of a TFT during manufacturing procedure 3 according to the present disclosure.
Figure 5:
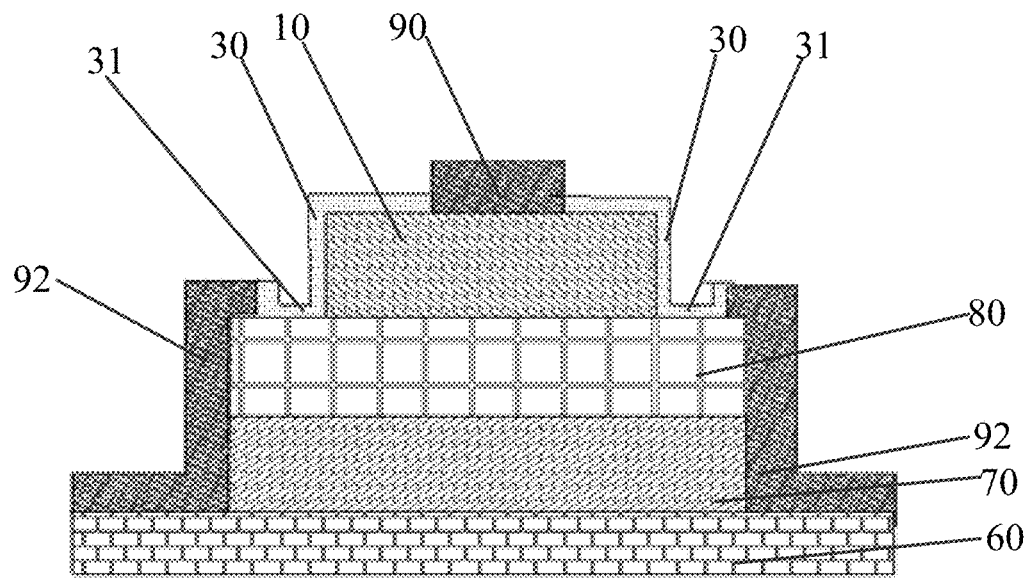
FIG. 5 schematically shows a structure of a TFT during manufacturing procedure 4 according to the present disclosure.
Figure 6:
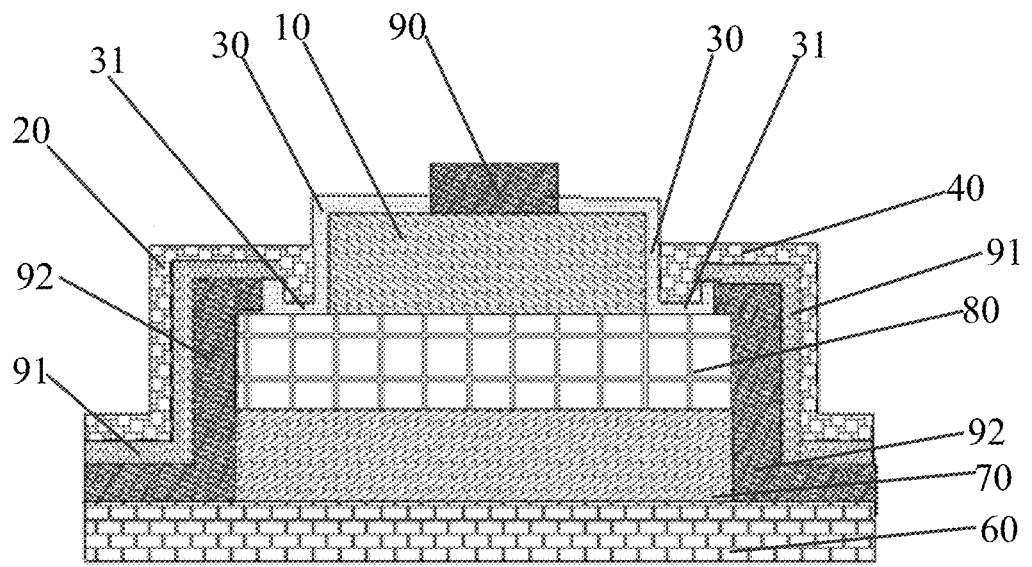
FIG. 6 schematically shows a structure of a TFT during manufacturing procedure 5 according to the present disclosure.

According to one specific embodiment, the TFT is manufactured by the following method. The gate 70 (which can also be call as a metal bottom-gate layer) is deposited on the glass layer 60 through a Physical Vapor Deposition (PVD) technology. The gate 70 is made of Al/Mo composite. The gate 70 can also be made of Al/Cu composite or other metal composites, and the present disclosure is not limited by this. Then, $SiO_2$ ($Al_2O_3$, or other materials) is deposited on the gate 70 through a Plasma Enhanced Chemical Vapor Deposition (PECVD) technology to serve as the gate insulation layer 80. The a-IGZO layer with a thickness of 70 nm is deposited on the gate insulation layer 80 through the PVD technology to serve as the active layer 10, and a structure of the TFT during manufacturing procedure 1 can be obtained, as shown in FIG. 2. The aforesaid structure is coated with a photoresist, and is exposed and developed with a properly designed photomask. After an extra photoresist is removed, the a-IGZO layer and the gate insulation layer are etched through a Half-Tone method. The gate 70 is etched through a wet etching technology so as to form a pattern. The photoresist is ashed. The a-IGZO layer is etched with oxalic acid to serve as the active layer 10 and a structure of the TFT during manufacturing procedure 2 can be obtained, as shown in FIG. 3. $SiO_2$ ($Al_2O_3$, or other materials) is deposited on the active layer 10 through the PECVD technology to serve as the first etch-proof layer 90. $SiO_2$ ($Al_2O_3$, or other materials) is deposited on the glass layer 60 through the PECVD technology to serve as the second etch-proof layer 92. The second etch-proof layer 92 is formed at two sides of the gate 70 respectively. The second etch-proof layer 92 is arranged between the glass layer 60 and the pixel electrodes 91. According to the present disclosure, the first etch-proof layer 90 and the second etch-proof layer 92 are made of a same material and by a same method. The first etch-proof layer 90 and the second etch-proof layer 92 are called as the etch-proof layer below. The etch-proof layer is etched to form a pattern. Before the etch-proof layer is etched, the photoresist is coated, exposed, and developed. Then, the etch-proof layer is dry etched to form a pattern with holes therein. In normal conditions, the photoresist should be removed after dry etching procedure. However, according to the present disclosure, the photoresist is not removed. Instead, an ITO layer with a thickness of 70 nm is deposited on the photoresist. As shown in FIG. 1, the ITO layer is deposited at two sides of the active layer 10. The ITO layer is deposited on a region of an upper surface of the active layer 10 apart from the first etch-proof layer 90. The ITO layer is arranged between the second etch-proof layer 92 and the active layer 10. A structure of the TFT during manufacturing procedure 3 can be obtained, as shown in FIG. 4. The photoresist and the ITO layer on the photoresist are removed, i.e., the extra ITO layer is removed. The ITO layer is annealed at a temperature in a range from 200° C. to 300° C., so that the ITO layer can be crystallized, and a conductive contact hole in the a-IGZO layer can be protected. The anti-damage layer 30 and the second anti-damage layer 31 can be formed. A structure of the TFT during manufacturing procedure 4 can be obtained, as shown in FIG. 5. The pixel electrodes 91 are made of ITO, and the S/D is made of Mo/Cu (Al/Mo or other metal composites). A pattern is also formed through the Half-Tone method, and a structure of the TFT during manufacturing procedure 5 can be obtained, as shown in FIG. 6. $Si_3N_4$ ($SiO_2$ or $Al_2O_3$) with a thickness of 200 nm is deposited on the first etch-proof layer 90 to serve as the protection layer 93. A length of the protection layer 93 is the same as a length of the glass layer 60. The protection layer 93 contacts with two ends of an upper surface of the glass layer 60. So far, the TFT according to the present disclosure can be obtained, and the structure thereof is shown in FIG. 1.

According to the present disclosure, the method for manufacturing the TFT is simple, and the TFT can be manufactured in the effective manner.

The present disclosure is illustrated in detail in combination with preferred embodiments hereinabove, but it can be understood that the embodiments disclosed herein can be improved or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure. The present disclosure is not limited by the specific embodiments disclosed herein, but includes all technical solutions falling into the protection scope of the claims.

LIST OF REFERENCE SIGNS

10—active layer;
20—source;
30—anti-damage layer;
31—second anti-damage layer;
40—drain;
60—glass layer;
70—gate;
80—gate insulation layer;
90—first etch-proof layer;
91—pixel electrodes;
92—second etch-proof layer;
93—protection layer; and
94—photoresist.

The invention claimed is:

1. A thin film transistor (TFT), wherein an anti-damage layer is arranged between an active layer and a source of the TFT, and the anti-damage layer is arranged between the active layer and a drain of the TFT:
    wherein the TFT comprises:
    a glass layer;
    a gate that is arranged on the glass layer;
    a gate insulation layer that is arranged on the gate;
    the active layer that is arranged on the gate insulation layer, and a first etch-roof layer that is arranged on the active layer, wherein a length of the active layer is less than a length of the gate insulation layer and larger than a length of the first etch-proof layer;
    the source that is arranged at one side of the active layer;
    the anti-damage layer that is arranged between the active layer and the source;
    the drain that is arranged at the other side of the active layer;
    the anti-damage layer that is arranged between the active layer and the drain;
    two pixel electrodes, wherein one pixel electrode is arranged at one side of the source far from the active layer, and the other pixel electrode is arranged at one side of the drain far from the active layer;
    a second etch-proof layer that is arranged at two sides of the gate respectively, wherein the second etch-proof layer is arranged between the glass layer and the pixel electrodes;
    a second anti-damage layer that is arranged between the second etch-proof layer and the active layer, and
    a protection layer that is arranged on the first etch-proof layer;
    wherein the anti-damage layer and the second anti-damage layer are both made of ITO.

2. The TFT according to claim 1, wherein the gate is made of Al/Mo composite or Al/Cu composite, and the source and the drain are both made of Al/Mo composite or Cu/Mo composite.

3. The TFT according to claim 1, wherein the gate insulation layer, the first etch-proof layer, and the second etch-proof layer are all made of silicon dioxide or alumina.

4. The TFT according to claim 1, wherein the pixel electrodes are made of ITO.

5. A method for manufacturing a TFT,
    wherein an anti-damage layer is arranged between an active layer and a source of the TFT, and the anti-damage layer is arranged between the active layer and a drain of the TFT; and
    wherein the method comprises steps of:
    S1, forming a gate on a glass layer, forming a gate insulation layer on the gate, forming the active layer on the gate insulation layer, forming a first etch-proof layer on the active layer, and enabling a length of the active layer to be less than a length of the gate insulation layer and larger than a length of the first etch-proof layer;

S2, forming the source at one side of the active layer, forming the anti-damage layer between the active layer and the source, forming the drain at the other side of the active layer, and forming the anti-damage layer between the active layer and the drain;

S3, forming two pixel electrodes, i.e., forming one pixel electrode at one side of the source far from the active layer, and forming the other pixel electrode at one side of the drain far from the active layer;

forming a second etch-proof layer at two sides of the gate respectively, and enabling the second etch-proof layer to be between the glass layer and the pixel electrodes;

S4: forming a protection layer on the first etch-proof layer;

wherein between step S3 and step S4, the method further comprises

S30, forming a second anti-damage layer between the second etch-proof layer and the active layer;

wherein the anti-damage layer and the second anti-damage layer are both made of ITO.

6. The method according to claim 5, wherein the anti-damage layer and the second anti-damage layer are formed by steps of:

A, forming a photoresist on the first etch-proof layer, forming the photoresist on the second etch-proof layer, forming the anti-damage layer on the photoresist, forming the anti-damage layer between the active layer and the source, forming the anti-damage layer between the active layer and the drain, and forming the second anti-damage layer between the second etch-proof layer and the active layer;

B, removing the photoresist on the first etch-proof layer and the anti-damage layer on the photoresist, and removing the photoresist on the second etch-proof layer and the anti-damage layer on the photoresist; and C, performing annealing on the anti-damage layer and the second anti-damage layer at a temperature in a range from 200° C. to 300° C.

* * * * *